(12) United States Patent
Yaku et al.

(10) Patent No.: US 8,987,905 B2
(45) Date of Patent: Mar. 24, 2015

(54) SEMICONDUCTOR PACKAGE AND METHOD FOR MANUFACTURING THE SAME

(71) Applicant: Mitutoyo Corporation, Kanagawa (JP)

(72) Inventors: Toru Yaku, Kawasaki (JP); Ken Mizuno, Motomiya (JP)

(73) Assignee: Mitutoyo Corporation, Kanagawa (JP)

( * ) Notice: Subject to any disclaimer, the term of this patent is extended or adjusted under 35 U.S.C. 154(b) by 99 days.

(21) Appl. No.: 13/712,092

(22) Filed: Dec. 12, 2012

(65) Prior Publication Data

US 2013/0181353 A1 Jul. 18, 2013

(30) Foreign Application Priority Data

Jan. 16, 2012 (JP) ................................ 2012-006442

(51) Int. Cl.
*H01L 23/48* (2006.01)
*H01L 23/52* (2006.01)
*H01L 29/40* (2006.01)
*H01L 23/544* (2006.01)
*H01L 23/498* (2006.01)
*H01L 23/00* (2006.01)

(52) U.S. Cl.
CPC ........ *H01L 23/544* (2013.01); *H01L 23/49838* (2013.01); *H01L 24/83* (2013.01); *H01L 2224/83* (2013.01)
USPC ............................ 257/741; 257/762; 257/773

(58) Field of Classification Search
CPC .. H01L 23/544; H01L 24/38; H01L 23/49838
USPC .......................................... 257/741, 762, 773
See application file for complete search history.

(56) References Cited

U.S. PATENT DOCUMENTS

| 4,835,534 | A | 5/1989 | Lucas |
| 6,566,747 | B2 | 5/2003 | Ohuchi et al. |
| 2003/0011075 | A1 | 1/2003 | Ohuchi et al. |
| 2009/0140427 | A1* | 6/2009 | Guinn ........................... 257/741 |

FOREIGN PATENT DOCUMENTS

| JP | 62-57098 A | 3/1987 |
| JP | 2-12847 A | 1/1990 |
| JP | 9-189515 A | 7/1997 |
| JP | 9-236454 A | 9/1997 |
| JP | 2001-339002 | 12/2001 |
| JP | 2002-333309 A | 11/2002 |
| JP | 2003-42811 A | 2/2003 |

* cited by examiner

*Primary Examiner* — Michelle Mandala
(74) *Attorney, Agent, or Firm* — Greenblum & Bernstein, P.L.C.

(57) ABSTRACT

A semiconductor package includes a semiconductor device and a substrate, the semiconductor device including a straight line portion on an outer periphery and the substrate supporting the semiconductor device. A foil positioning pattern is formed on a front surface of the substrate, the positioning pattern touching the straight line portion of the semiconductor device to regulate a position of the semiconductor device.

24 Claims, 10 Drawing Sheets

SEMICONDUCTOR PACKAGE AND METHOD FOR MANUFACTURING THE SAME

CROSS-REFERENCE TO RELATED APPLICATIONS

The present application claims priority under 35 U.S.C. §119 of Japanese Application No. 2012-006442, filed on Jan. 16, 2012, the disclosure of which is expressly incorporated by reference herein in its entirety.

BACKGROUND OF THE INVENTION

1. Field of the Invention

The present invention relates to a semiconductor package that includes a semiconductor device and a substrate supporting the semiconductor device, and to a method for manufacturing the same.

2. Description of Related Art

Conventionally, a wiring pattern of a foil such as copper is formed on a front surface of a substrate in a semiconductor package. A semiconductor device is then positioned and installed in a predetermined position on top of the substrate and terminals on the semiconductor device are directly connected or indirectly connected via bond wires to the wiring pattern on the substrate. In most cases, in this type of semiconductor package, the semiconductor device portion is sealed by a black resin (see, e.g., Related Art 1). However, there are also semiconductor packages in which the semiconductor device portion is sealed by a transparent resin, such as a semiconductor package that includes an optical semiconductor device such as a light receiving element having a photodiode array for detecting optical displacement, for example. In a semiconductor package of this kind that includes the optical semiconductor device, a position of the semiconductor device on the substrate affects a degree of accuracy for displacement detection. Therefore, highly accurate positioning of the semiconductor device on the substrate is required.

A method for positioning and installing the semiconductor device on the substrate with a high degree of accuracy is known in which the semiconductor device is installed on the front surface of the substrate while correcting misalignment in positions and orientations of the substrate and the semiconductor device by detecting the position and orientation of each by capturing images of each with a camera (see, e.g., Related Art 2). However, in order to detect and correct misalignment in the position and orientation of the substrate and the semiconductor device by capturing images of each with the camera, an instrument such as a component placement system is necessary. Meanwhile, in a case where a comparatively low number of semiconductor packages are manufactured, as with the semiconductor package that includes the optical semiconductor device, for example, introduction of an instrument such as the component placement system is difficult from a cost perspective. In addition, when the semiconductor device is split off from a semiconductor wafer, irregularly shaped breakages called chipping may be formed on an outer periphery (see, e.g., Related Art 3). When chipping has formed on the outer periphery of the semiconductor device, detecting the position and orientation of the semiconductor device based on the shape of the outer periphery of the semiconductor device may lead to a reduction of accuracy in the detection of the position and orientation of the semiconductor device.

In addition, a method is known in which a capture mark is formed on the substrate and the semiconductor device and the position and orientation of each is detected (see, e.g., Related Art 4). However, depending on a type of the semiconductor device, forming the capture mark may be difficult. For example, when the semiconductor device is the light receiving element having the photodiode array, the region where the photodiode array is to be provided may overlap with the region where the capture mark is to be formed. Moreover, forming the capture mark in a region other than the region where the capture mark is typically formed in order to not overlap with the region where the photodiode array is to be provided may lead to a reduction of accuracy in the detection of the position and orientation of the semiconductor device.

In contrast, a method is known in which a positioning hole or notch is formed in the semiconductor device and substrate, then the semiconductor device is positioned on the substrate by engaging a positioning jig to the positioning hole or notch (see, e.g., Related Arts 5 and 6). In addition, a method is known in which the semiconductor device is positioned on the substrate by mounting a positioning nub to the substrate and abutting the semiconductor device on this nub (see, e.g., Related Art 7).

Related Art 1: Japanese Patent No. 3292723
Related Art 2: Japanese Publication No. S62-57098
Related Art 3: Japanese Patent Laid-open Publication No. 2002-333309
Related Art 4: Japanese Patent Laid-open Publication No. H2-12847
Related Art 5: Japanese Patent Laid-open Publication No. H9-236454
Related Art 6: Japanese Patent Laid-open Publication No. 2003-42811
Related Art 7: Japanese Patent Laid-open Publication No. H9-189515

However, in the case of the method in which the positioning hole or notch is formed on the semiconductor device and substrate to engage with the positioning jig, in order to increase accuracy in positioning of the semiconductor device, the hole or notch must be formed with a high degree of accuracy. In order to form such a highly accurate hole or notch, production time increases and costs increase. In addition, in the case of the method in which the positioning nub is mounted to the substrate, in order to increase accuracy in positioning of the semiconductor device, the positioning nub must be mounted to the substrate with a high degree of accuracy. In order to mount the positioning nub to the substrate with a high degree of accuracy, production time increases and costs increase.

SUMMARY OF THE INVENTION

The present invention was conceived in light of the above-described circumstances and provides a semiconductor package and a method for manufacturing the same that is capable of achieving highly accurate positioning of a semiconductor device on a substrate at a low cost.

The present invention resolves the above-described circumstances with a semiconductor package that includes a semiconductor device (also referred to as a "semiconductor") and a substrate, the semiconductor device having a straight line portion (also referred to as a "straight line segment") on an outer periphery and the substrate supporting the semiconductor device. In the semiconductor package, a foil positioning pattern is formed on a front surface of the substrate, the positioning pattern touching the straight line portion of the semiconductor device to regulate (i.e., set) a position of the semiconductor device.

In addition, the present invention resolves the above-described circumstances with a method for manufacturing the semiconductor package that includes a pattern forming process and a semiconductor device installation process. In the pattern forming process, the foil positioning pattern for regulating the position of the semiconductor device is formed on the front surface of the substrate, which supports the semiconductor device having the straight line portion on the outer periphery thereof. In the semiconductor device installation process, the semiconductor device is installed on the front surface of the substrate while regulating the position of the semiconductor device by abutting the straight line portion of the semiconductor device on the positioning pattern.

The foil positioning pattern can be formed with a high degree of accuracy on the front surface of the substrate in a process similar to a process for a foil wiring pattern. By abutting the straight line portion of the semiconductor device on the positioning pattern, the semiconductor device can be positioned and installed on the front surface of the substrate with a high degree of accuracy. Accordingly, highly accurate positioning of the semiconductor device can be achieved at a low cost.

According to the present invention, highly accurate positioning of the semiconductor device on the substrate can be achieved at a low cost.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Figure 1:
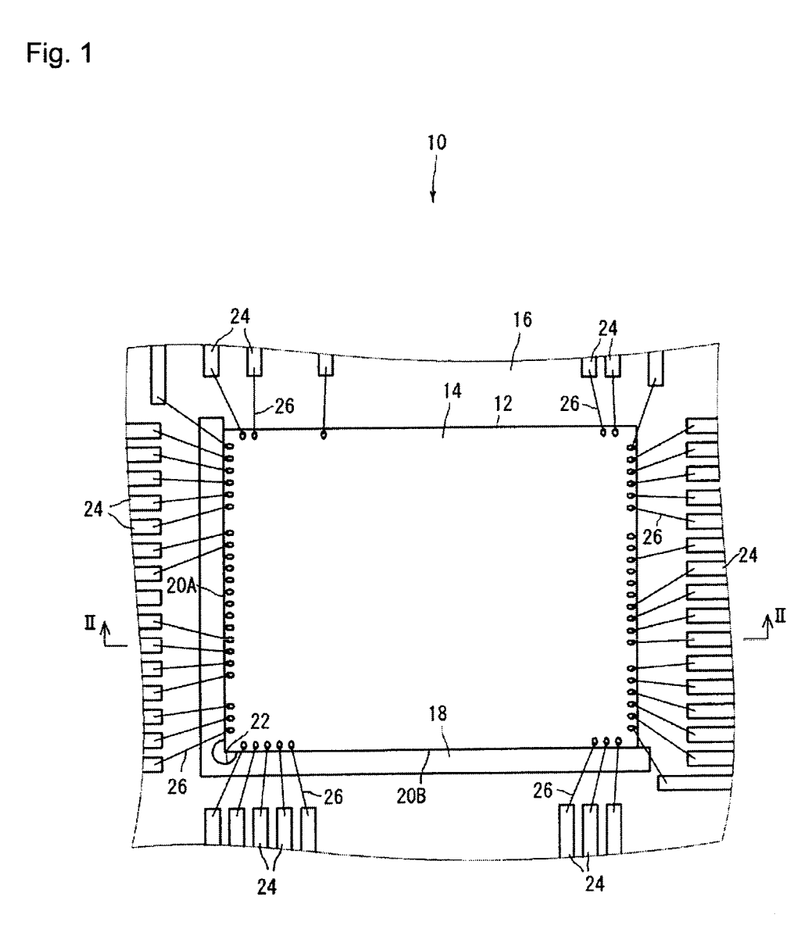
FIG. 1 is a plan view schematically illustrating a configuration for a portion where a semiconductor device is installed in a semiconductor package according to a first embodiment of the present invention.
Figure 2:
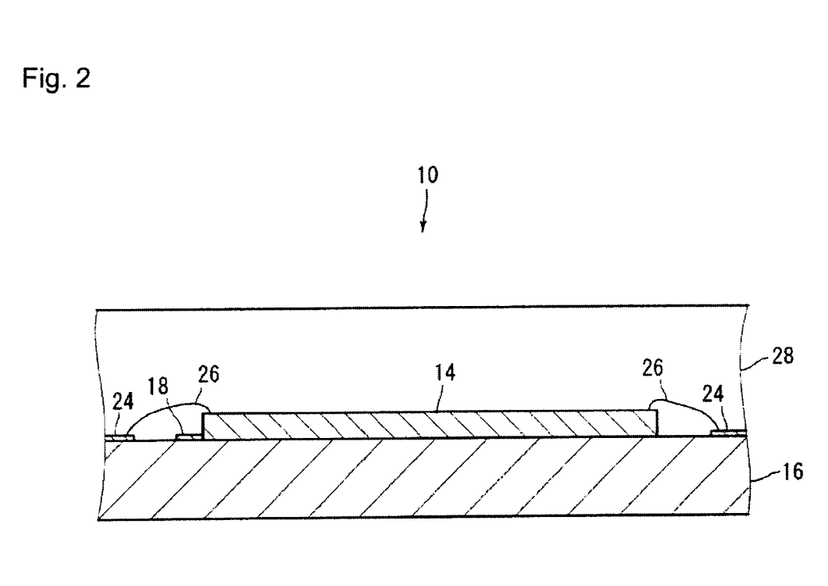
FIG. 2 is a cross-sectional view along a line II-II in FIG. 1.

Hereafter, preferred embodiments of the present invention are described with reference to the drawings. As shown in FIGS. 1 and 2, a semiconductor package 10 according to a first embodiment of the present invention includes a semiconductor device 14 and a substrate 16, the semiconductor device 14 having straight line portions on an outer periphery 12 and the substrate 16 supporting the semiconductor device 14. A foil positioning pattern 18 that touches the straight line portions of the semiconductor device 14 to regulate a position of the semiconductor device 14 is formed on a front surface of the substrate 16. Other structures are not considered particularly essential to an understanding of the present embodiment, and thus descriptions thereof are omitted as appropriate.

The semiconductor device 14 is a light receiving element that includes a photodiode array for detecting optical displacement. More specifically, the semiconductor device 14 is rectangular and includes a first straight line portion 20A and a second straight line portion 20B on the outer periphery 12, the first straight line portion 20A and the second straight line portion 20B forming a right angle with respect to each other. Moreover, portions on the outer periphery 12 of the semiconductor device 14 that are related to the first straight line portion 20A and the second straight line portion 20B as an opposing side are also straight line portions. As shown in FIG. 1, when the semiconductor device 14 is rectangular, a direction of the photodiode array (columnar direction of photodiodes) preferably matches a length direction of the semiconductor device 14. The semiconductor device 14 has a thickness in a range of approximately 0.05 to 0.7 mm. The thickness is appropriately selected in consideration of a manufacturing process cost, yield ratio, and the like for the semiconductor device. Moreover, when the semiconductor device 14 is clipped from a semiconductor wafer, irregularly shaped breakages called chipping may be formed on the outer periphery 12, such as damage or peeling of a surface layer film. For example, a portion on a bottom surface side of the outer periphery 12 may be missing. Such damage is preferably as small as possible. Processing requirements for the clipping process are considered such that a range where the damage occurs is less than 10 µm from a bottom surface.

A material for the substrate 16 is a known material such as paper phenol, paper epoxy, glass composite, glass epoxy, Teflon (registered trademark), alumina, and LTCC.

Figure 3:
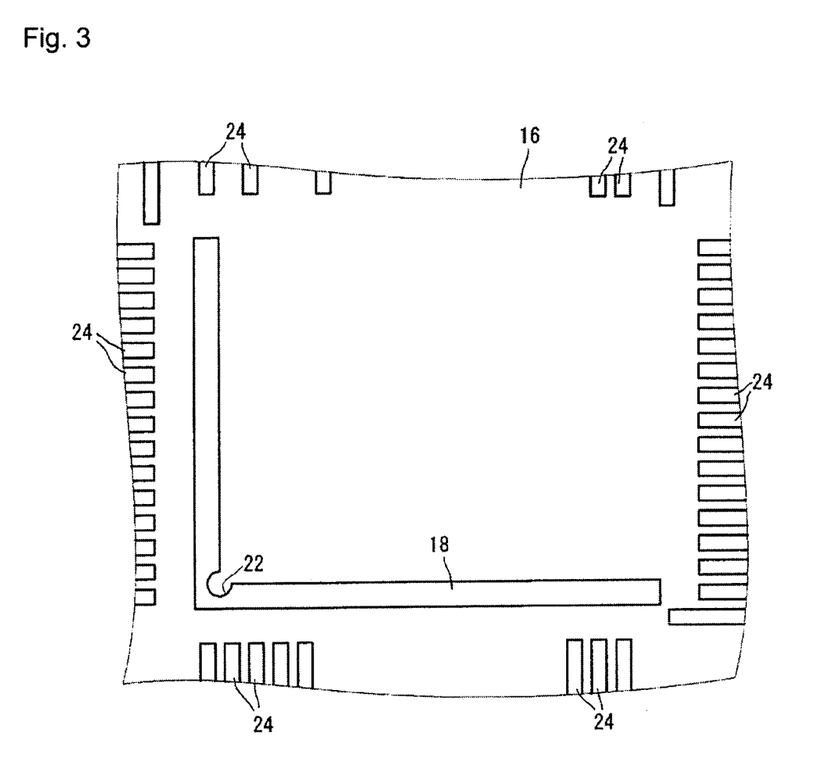
FIG. 3 is a plan view schematically illustrating a configuration for a portion where a semiconductor device is installed in the semiconductor package prior to installation of the semiconductor device.
Figure 4:
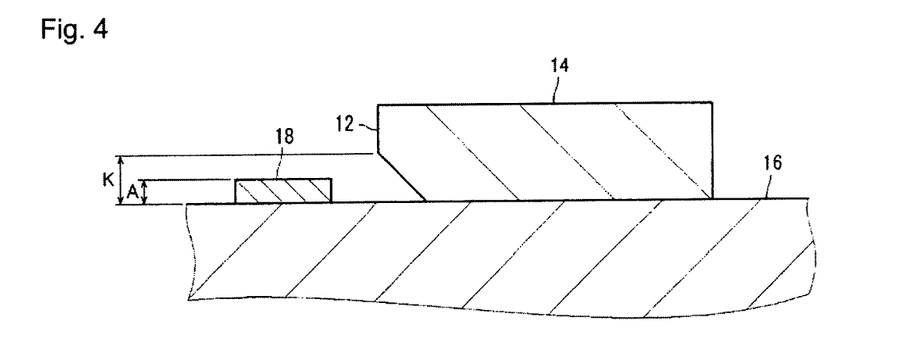
FIG. 4 is a cross-sectional view schematically illustrating an enlarged view of a state in which a thickness of a positioning pattern is thinner than a height from a bottom surface of chipping on an outer periphery of the semiconductor device.
Figure 5:
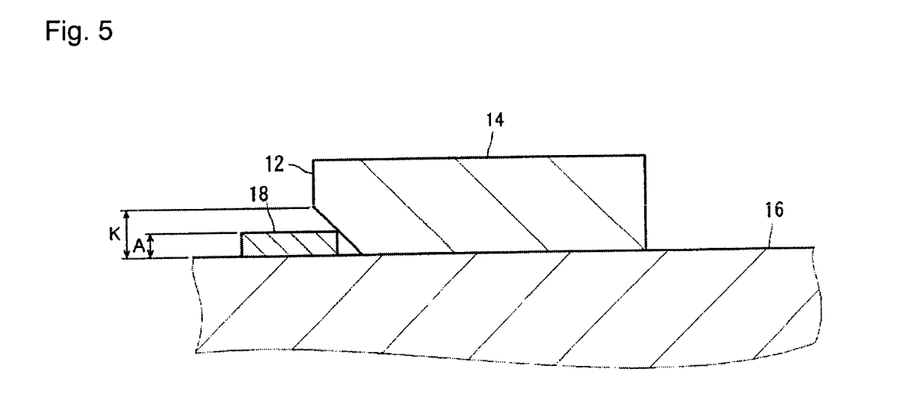
FIG. 5 is a cross-sectional view schematically illustrating an enlarged view of a state where the outer periphery on which chipping has been formed abuts the positioning pattern.
Figure 6:
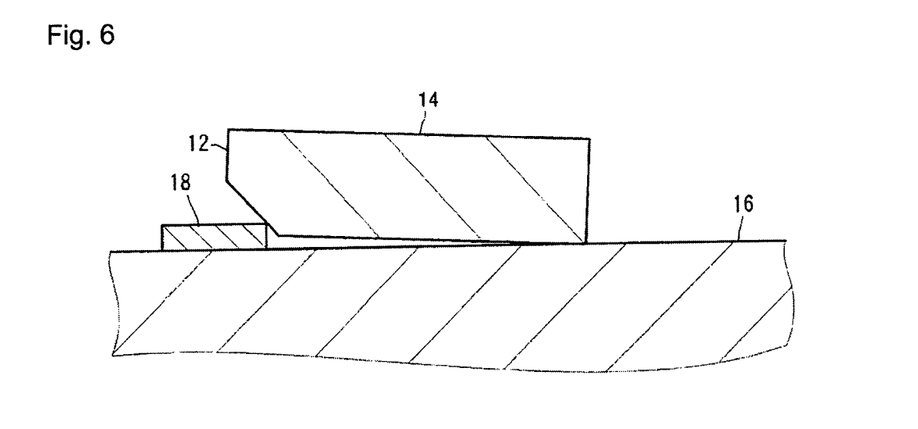
FIG. 6 is a cross-sectional view schematically illustrating an enlarged view of a state where the outer periphery on which chipping has been formed lifts onto the positioning pattern.
Figure 7:
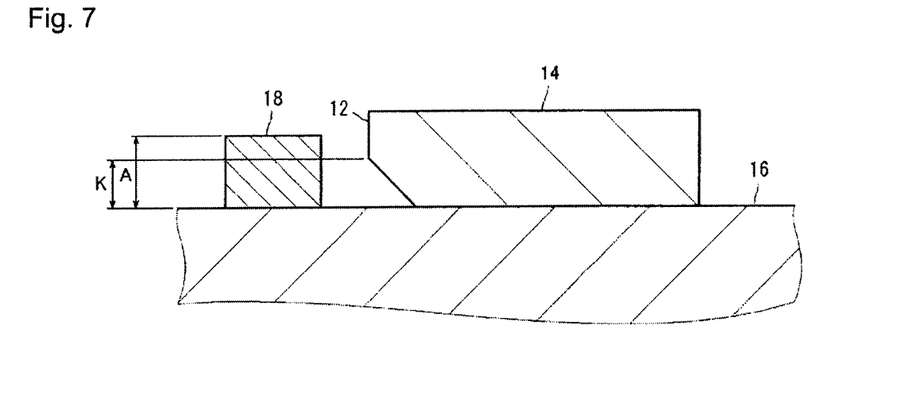
FIG. 7 is a cross-sectional view schematically illustrating an enlarged view of a state in which the thickness of the positioning pattern is thicker than the height from the bottom surface of chipping on the outer periphery of the semiconductor device.
Figure 8:
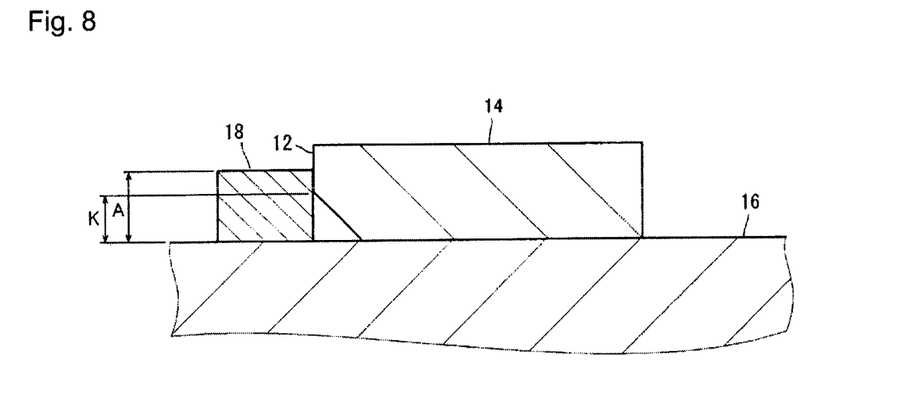
FIG. 8 is a cross-sectional view schematically illustrating an enlarged view of a state in which the outer periphery on which chipping has been formed abuts the positioning pattern.

A material for the positioning pattern 18 is a foil such as copper foil and aluminum foil. As shown in FIG. 3, the positioning pattern 18 has an "L" shape in a planar view. As shown in FIG. 1, the positioning pattern 18 touches both the first straight line portion 20A and the second straight line portion 20B. The semiconductor device 14 is rectangular. As shown in FIG. 1, when the positioning pattern 18 has the "L" shape configured by two straight line portions of different lengths, the longer of the straight line portions of the positioning pattern 18 preferably touches the longer of the straight line portions of the semiconductor device 14 (the second straight line portion 20B). In addition, a notch 22 having a shape indented away from a corner of the semiconductor device 14 is formed on an interior corner of the L-shaped positioning pattern 18. Moreover, the irregular breakage called chipping may form on the outer periphery 12 of the semiconductor device 14 as described above. When a thickness A of the positioning pattern 18 is thinner than a height K from the bottom surface of a missing portion on the outer periphery 12 of the semiconductor device 14, as shown in FIG. 4, the semiconductor device 14 abuts the positioning pattern 18 at the missing portion on the outer periphery 12, as shown in FIG. 5. In addition, as shown in FIG. 6, the semiconductor device 14 may also lift up on the positioning pattern 18, which accordingly becomes a cause of reduction in positioning accuracy for the semiconductor device 14. In contrast, when the thickness A of the positioning pattern 18 is thicker than the height K from the bottom surface of the missing portion on the outer periphery 12 of the semiconductor device 14, as shown in FIG. 7, the semiconductor device 14 abuts the positioning pattern 18 at a portion of the outer periphery 12 where no damage has occurred, as shown in FIG. 8, and thus the semiconductor device 14 can be accurately positioned on the substrate 16. As described above, a clipping process for semiconductor devices has been considered such that a range where damage to the outer periphery 12 of the semiconductor device 14 occurs is less than 10 µm from the bottom surface. Therefore, when the thickness of the positioning pattern 18 is 10 µm or greater, an undamaged portion of the outer periphery 12 of the semiconductor device 14 can reliably abut the positioning pattern 18. Accordingly, the thickness of the positioning pattern 18 is preferably 10 µm or greater. In addition, the thickness of the positioning pattern 18 is preferably thinner than the thickness of the semiconductor device 14. The thickness of the positioning pattern 18 is typically 18 µm, 35 µm, 70 µm, and the like.

In addition, a foil wiring pattern 24 is also formed on the front surface of the substrate 16. The material and thickness for the wiring pattern 24 are the same as those for the positioning pattern 18. The wiring pattern 24 is connected to terminals of the semiconductor device 14 via bond wires 26. By making the thickness of the positioning pattern 18 thinner than the thickness of the semiconductor device 14, interference between the bond wires 26 and the positioning pattern 18 can be avoided.

In addition, the semiconductor package 10 is sealed by a sealing resin 28 on a side where the semiconductor device 14 is installed on the substrate 16. A transparent epoxy-type resin, for example, may be used as a material for the sealing resin 28.

Figure 9:
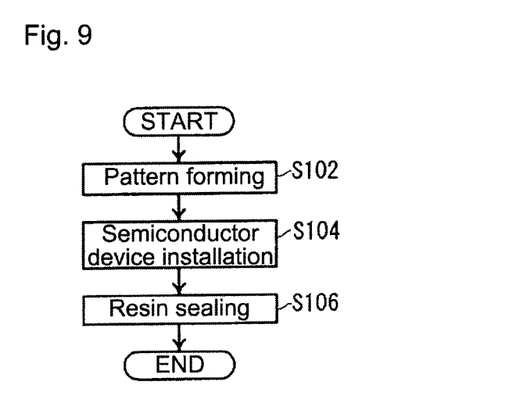
FIG. 9 is a flowchart illustrating an overview of a method for manufacturing the semiconductor package.

Next, following a flowchart in FIG. 9, a manufacturing method for the semiconductor package 10 is described. First, the foil positioning pattern 18 for regulating the position of the semiconductor device 14 is formed on the front surface of the substrate 16 (S102: pattern forming process). In addition to the positioning pattern 18, the wiring pattern 24 is also formed on the front surface of the substrate 16 in this process, the wiring pattern 24 having the same material and thickness as those of the positioning pattern 18 (see FIG. 3). Specifically, foil such as copper foil is spread across the front surface of the substrate 16 and is processed into the shapes of the positioning pattern 18 and the wiring pattern 24 using a photolithography method. When a wiring pattern is also formed on a rear surface of the substrate 16, foil such as copper foil is also spread across the rear surface of the substrate 16 and is processed into the shape of the wiring pattern using the photolithography method. In addition, through-holes are formed in the substrate 16 so as to communicate with wirings on both surfaces. Furthermore, the through-holes are formed so as to be filled by plating in order to electrically connect the wiring patterns on both surfaces.

Figure 10:
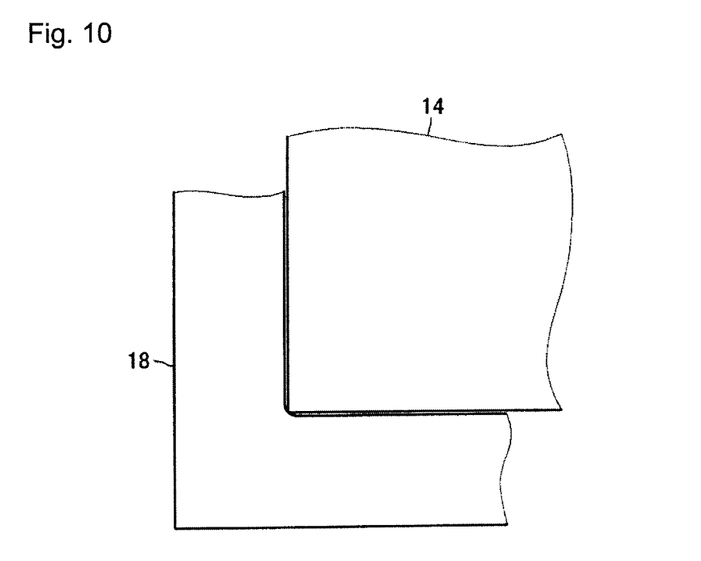
FIG. 10 is a plan view schematically illustrating an enlarged view of a state of abutment in the semiconductor device when an etching fillet is formed on an interior corner of an L-shaped positioning pattern.
Figure 11:
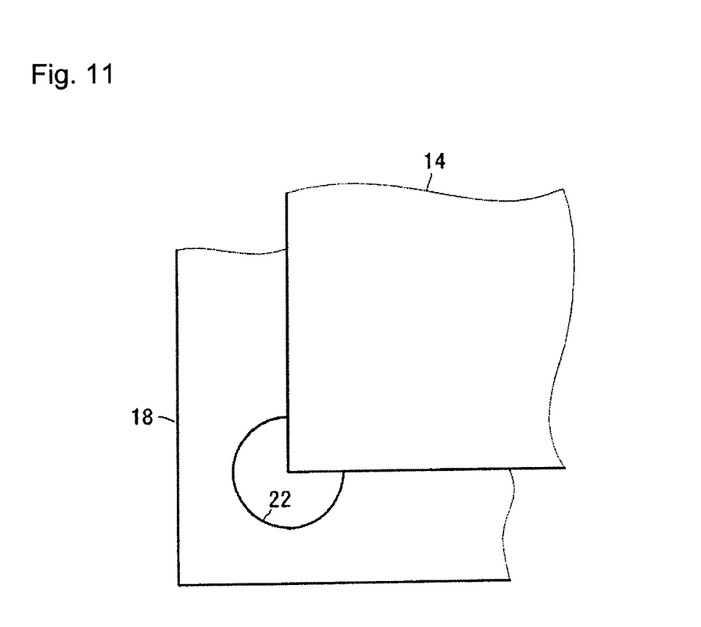
FIG. 11 is a plan view schematically illustrating an enlarged view of a state of abutment in the semiconductor device when a notch is formed on the interior corner of the L-shaped positioning pattern.

Next, the semiconductor device 14 is installed on the front surface of the substrate 16 while regulating the position of the semiconductor device 14 by abutting the first straight line portion 20A and the second straight line portion 20B of the semiconductor device 14 on the positioning pattern 18 (S104: semiconductor device installation process). When no notch is formed in the interior corner of the L-shaped positioning pattern 18, as shown in FIG. 10, an etching fillet is formed in the interior corner of the positioning pattern 18. There is thus a possibility that the corner of the semiconductor device 14 and the interior corner of the L-shaped positioning pattern 18 may interfere with each other and a gap may occur between the positioning pattern 18 and the first straight line portion 20A and/or the second straight line portion 20B of the semiconductor device 14. However, in the present first embodiment, the notch 22 is formed on the interior corner of the L-shaped positioning pattern 18, the notch 22 having a shape indented away from the corner of the semiconductor device 14. Therefore, as shown in FIG. 11, the corner of the semiconductor device 14 and the interior corner of the L-shaped positioning pattern 18 do not interfere with each other. Accordingly, the first straight line portion 20A and the second straight line portion 20B of the semiconductor device 14 can reliably abut the positioning pattern 18 and accurate positioning of the semiconductor device 14 on the substrate 16 is possible. When the semiconductor device 14 is installed on the substrate 16, an adhesive of an epoxy resin or the like is applied to a plurality of locations (for example, five locations) on the contact surfaces of the substrate 16 and/or the semiconductor device 14. In addition, the terminals on the semiconductor device 14 and the wiring pattern 24 are connected via the bond wires 26.

Next, the side where the semiconductor device 14 has been installed on the substrate 16 is sealed by the sealing resin 28 (S106: resin sealing process). Specifically, the semiconductor device 14 and the substrate 16 are installed in a mold of a resin molding apparatus such as a transfer molding apparatus. The side where the semiconductor device 14 has been installed on the substrate 16 is then sealed by the sealing resin 28 so as to cover the semiconductor device 14, thus completing the semiconductor package 10.

As described above, in the pattern forming process (S102), the foil positioning pattern 18 can be formed with a high degree of accuracy on the front surface of the substrate 16 along with the foil wiring pattern 24 using a method such as lithography. In addition, by abutting the first straight line portion 20A and the second straight line portion 20B of the semiconductor device 14 on the positioning pattern 18, the semiconductor device 14 can be positioned and installed on the front surface of the substrate 16 with a high degree of accuracy. Accordingly, with the semiconductor package 10, highly accurate positioning of the semiconductor device 14 can be achieved at a low cost.

In the present first embodiment, the notch 22 having a shape indented away from the corner of the semiconductor device 14 is formed on the interior corner of the L-shaped positioning pattern 18. However, in a case where the corner of the semiconductor device 14 has a chamfered shape and the corner of the semiconductor device 14 and the interior corner of the L-shaped positioning pattern 18 do not interfere with each other even when the etching fillet is formed on the interior corner of the L-shaped positioning pattern 18, for example, no notch need be formed on the interior corner of the L-shaped positioning pattern 18.

Figure 12:
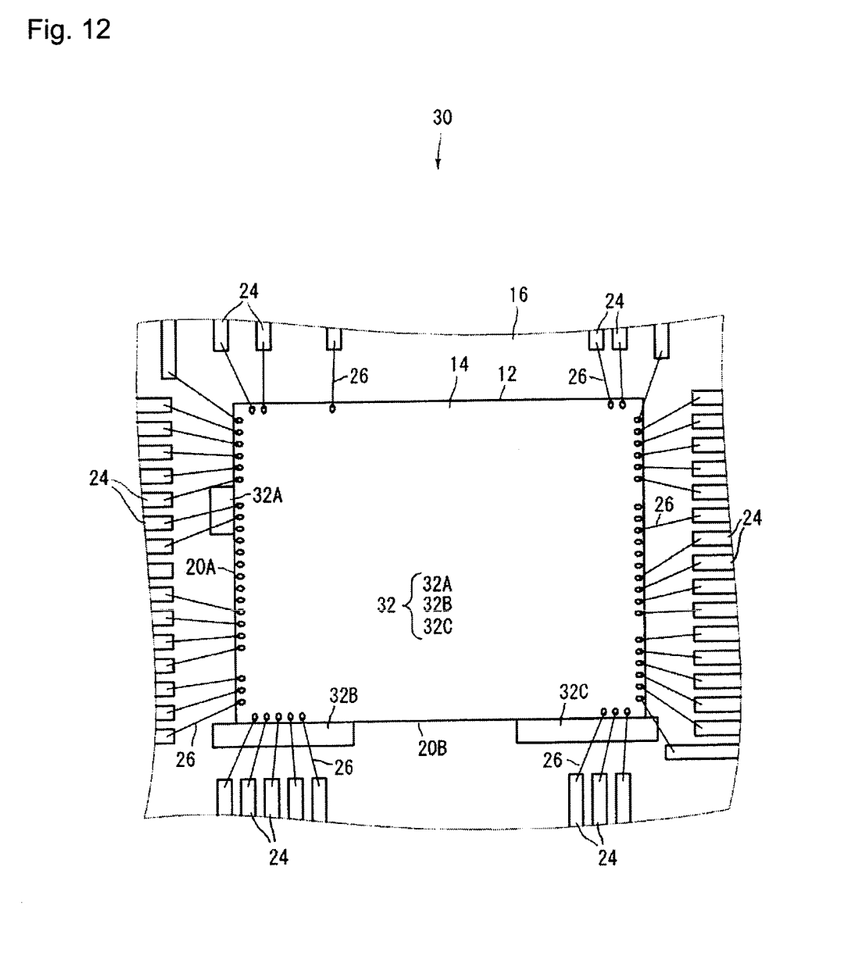
FIG. 12 is a plan view schematically illustrating a view of a configuration for a portion where a semiconductor device is installed in a semiconductor package according to a second embodiment of the present invention.
Figure 13:
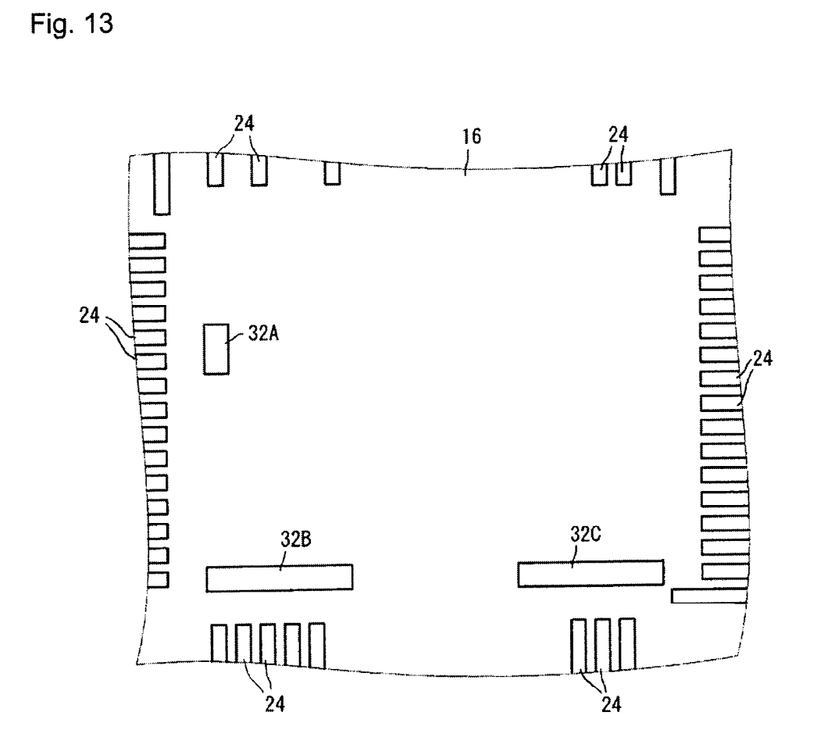
FIG. 13 is a plan view schematically illustrating a view of a configuration for a portion where a semiconductor device is installed in the semiconductor package prior to installation of the semiconductor device.

Next, a second embodiment of the present invention is described. A single (one) L-shaped positioning pattern 18 is formed on the front surface of the substrate 16 in the semiconductor package 10 of the first embodiment. In contrast, as shown in FIGS. 12 and 13, a semiconductor package 30 in the present second embodiment includes a positioning pattern 32 formed on the front surface of the substrate 16, the positioning pattern 32 being divided into three positioning pattern elements 32A, 32B, and 32C. Other structures are similar to the first embodiment. Therefore, similar structures are given the same reference numerals as those in FIGS. 1 to 11 and descriptions thereof are omitted.

The positioning pattern 32 touches the first straight line portion 20A at the positioning pattern element 32A and touches the second straight line portion 20B at the positioning pattern elements 32B and 32C. More specifically, each of the positioning pattern elements 32A, 32B, and 32C are rectangular in a planar view. The positioning pattern element 32A touches the first straight line portion 20A at a portion away from an end portion of the first straight line portion 20A. Meanwhile, the positioning pattern elements 32B and 32C touch end portions and portions near the end portions of the second straight line portion 20B. In addition, the positioning pattern elements 32B and 32C are separated in an extension direction of the second straight line portion 20B. A portion of the positioning pattern elements 32B and 32C projects in the extension direction of the second straight line portion 20B past the respective end portions of the second straight line portion 20B. The projecting portions do not touch the second straight line portion 20B. The material and thickness for the positioning pattern 32 are the same as those for the positioning pattern 18 and the wiring pattern 24. When the semiconductor device 14 is rectangular, the positioning pattern 32 preferably touches two points on the longer of the straight line portions of the semiconductor device 14 (the second straight line portion 20B), the two points having a span that is as long as possible. As shown in FIG. 12, the positioning pattern 32 more preferably touches both end portions of the longer of the straight line portions of the semiconductor device 14 (the second straight line portion 20B).

The positioning pattern 32 of the semiconductor package 30 in the present second embodiment is also foil. Therefore, in the pattern forming process (S102), the positioning pattern 32 can be formed with a high degree of accuracy on the front surface of the substrate 16 along with the wiring pattern 24 using a method such as lithography. In addition, in the semiconductor device installation process (S104), the first straight line portion 20A of the semiconductor device 14 abuts the positioning pattern element 32A, and the second straight line portion 20B abuts the positioning pattern elements 32B and 32C. Thereby, the semiconductor device 14 can be positioned and installed on the front surface of the substrate 16 with a high degree of accuracy. Accordingly, highly accurate positioning of the semiconductor device 14 can be achieved at a low cost in the semiconductor package 30, as well.

Figure 14:
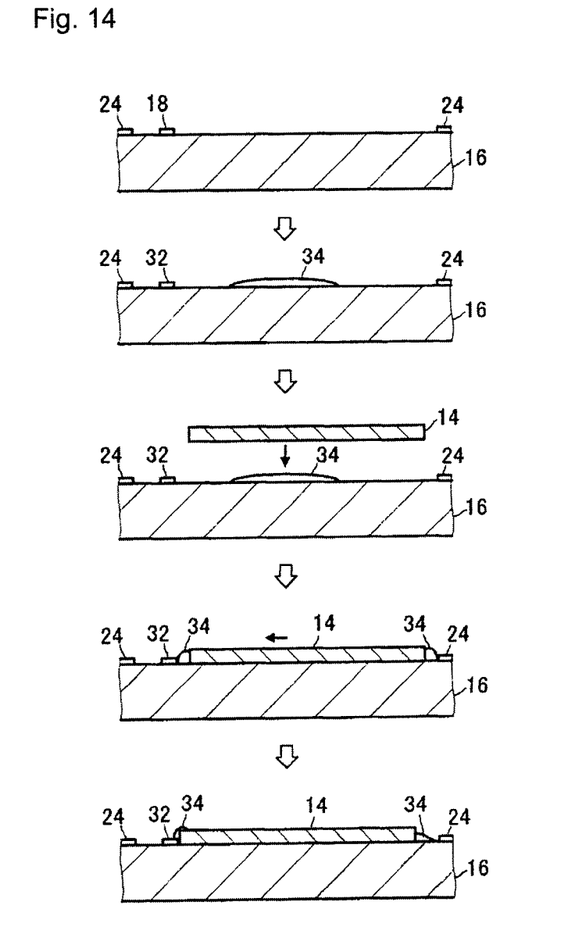
FIG. 14 is a cross-sectional view schematically illustrating a view of an example of behavior of an adhesive when the semiconductor device is installed on the substrate.

In addition, as shown in FIG. 14, when a large amount of an adhesive 34 is applied to the contact surfaces of the semiconductor device 14 and the substrate 16 and the adhesive 34 sticks out from the contact surfaces, there is a possibility that the excess adhesive 34 may spill over onto the semiconductor device 14 from between the first straight line portion 20A and the second straight line portion 20B of the semiconductor device 14 and the positioning pattern 32 and bond to the terminals of the semiconductor device 14. However, the positioning pattern elements 32B and 32C are separated in the extension direction of the second straight line portion 20B and, in addition, the positioning pattern elements 32A and 32B are separated. Therefore, the excess adhesive 34 can escape in a surface direction from between the positioning pattern elements 32B and 32C, or from between the positioning pattern elements 32A and 32B. Accordingly, a situation in which the excess adhesive 34 spills over onto the semiconductor device 14 and bonds to the terminals of the semiconductor device 14 is unlikely to occur.

The portion of the L-shaped positioning pattern 18 touching the first straight line portion 20A and/or the portion touching the second straight line portion 20B may be separated (in the extension direction of the touching straight line portion) in the first embodiment, as well. Thereby, a situation in which the excess adhesive 34 spills over onto the semiconductor device 14 and bonds to the terminals of the semiconductor device 14 is unlikely to occur, similar to the present second embodiment.

Figure 15:
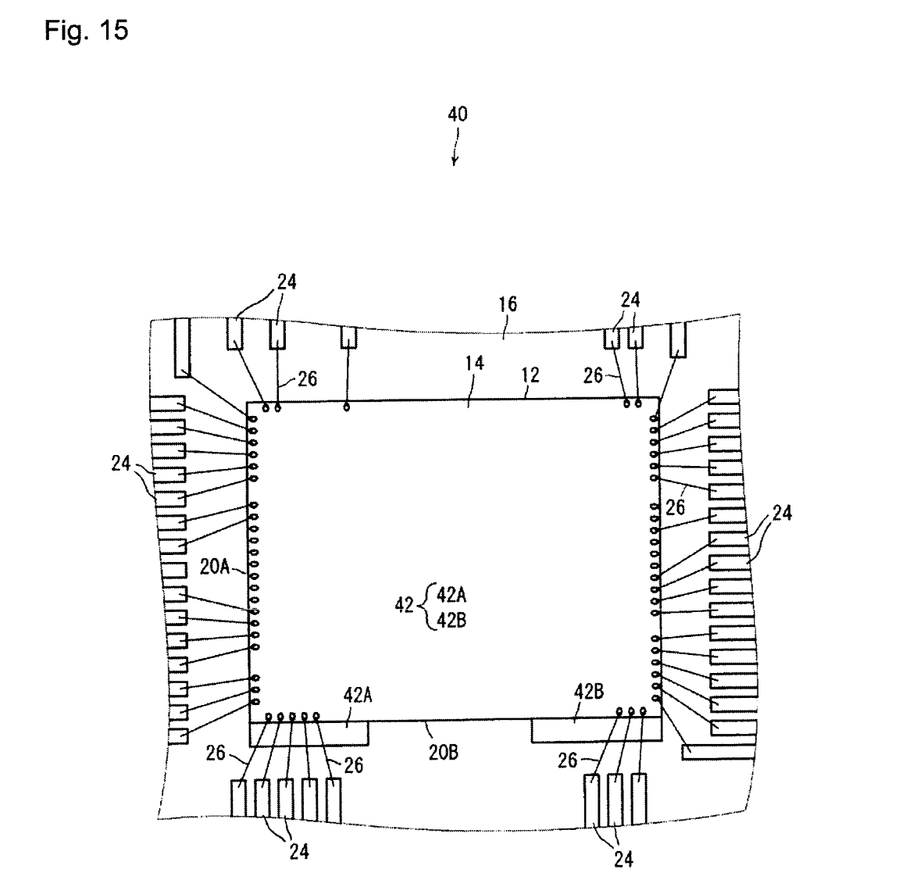
FIG. 15 is a plan view schematically illustrating a view of a configuration for a portion where a semiconductor device is installed in a semiconductor package according to a third embodiment of the present invention.

Next, a third embodiment of the present invention is described. In the semiconductor package 10 of the first embodiment and the semiconductor package 30 of the second embodiment, the positioning patterns 18 and 32 touch both the first straight line portion 20A and the second straight line portion 20B of the semiconductor device 14. In contrast, as shown in FIG. 15, in a semiconductor package 40 in the present third embodiment, a positioning pattern 42 touches only the second straight line portion 20B of the semiconductor device 14 and does not touch the first straight line portion 20A. In addition, positions of the end portions of the second straight line portion 20B and positions of end portions of the positioning pattern 42 are matched up. Other structures are similar to the first and second embodiments. Therefore, similar structures are given the same reference numerals as those in FIGS. 1 to 14 and descriptions thereof are omitted.

The positioning pattern 42 is configured with positioning pattern elements 42A and 42B, which are separated in the extension direction of the second straight line portion 20B. More specifically, the positioning pattern elements 42A and 42B are rectangular and touch end portions and portions near the end portions of the second straight line portion 20B. The position of the end portion of the positioning pattern element 42A matches up (i.e., aligns) with the position of a first end portion of the second straight line portion 20B. The position of the end portion of the positioning pattern element 42B matches up (i.e., aligns) with the position of a second end portion of the second straight line portion 20B. The material and thickness for the positioning pattern 42 are the same as those for the positioning pattern 18, the positioning pattern 32, and the wiring pattern 24. When the semiconductor device 14 is rectangular, as shown in FIG. 15, the positioning pattern 42 preferably touches the longer of the straight line portions of the semiconductor device 14 (the second straight line portion 20B). In addition, as shown in FIG. 15, the positioning pattern 42 more preferably touches both ends of the longer of the straight line portions of the semiconductor device 14 (the second straight line portion 20B).

The positioning pattern 42 of the semiconductor package 40 in the present third embodiment is also foil. Therefore, in the pattern forming process (S102), the positioning pattern 42 can be formed with a high degree of accuracy on the front surface of the substrate 16 along with the wiring pattern 24 using a method such as lithography. Moreover, in the semiconductor device installation process (S104), the second straight line portion 20B of the semiconductor device 14 abuts the positioning pattern elements 42A and 42B. In addition, while monitoring via a microscope or the like, the position of a first end portion of the second straight line portion 20B is matched up with the position of the end portion of one of the positioning pattern elements 42A and 42B. Thereby, the semiconductor device 14 can be positioned and installed on the front surface of the substrate 16 with a high degree of accuracy. When the position of the first end portion of the second straight line portion 20B is matched up with the position of the end portion of one of the positioning pattern elements 42A and 42B, the position of the second end portion of the second straight line portion 20B automatically matches up with the position of the end portion of the second positioning pattern element. Accordingly, highly accurate positioning of the semiconductor device 14 can be achieved at a low cost in the semiconductor package 40, as well. In addition, the positioning pattern 42 does not touch the first straight line portion 20A of the semiconductor device 14. Therefore, the excess adhesive 34 does not spiller over onto the semiconductor device 14 from between the first straight line portion 20A and the positioning pattern to bond to the terminals of the semiconductor device 14. In addition, the positioning pattern elements 42A and 42B are separated in the extension direction of the second straight line portion 20B. Therefore, a situation in which the excess adhesive 34 spills over onto the semiconductor device 14 from between the second straight line portion 20B and the positioning pattern 42 to bond to the terminals of the semiconductor device 14 is unlikely to occur.

In the present third embodiment, the position of the end portion of the positioning pattern element 42A matches up with the position of the first end portion of the second straight line portion 20B and the position of the end portion of the positioning pattern element 42B matches up with the position Of the second end portion of the second straight line portion 20B. However, when the position of the end portion of either one of the two positioning pattern elements is matched up with the position of one end portion of the second straight line portion 20B, the semiconductor device 14 can be accurately positioned on the substrate 16. Therefore, the position of the end portion of the other of the two positioning pattern elements does not need to match up with the position of the end portion of the second straight line portion 20B. For example, the end portion of the other positioning pattern element may project further than the position of the end portion of the second straight line portion 20B.

In addition, in the present third embodiment, the positioning pattern elements 42A and 42B are separated in the extension direction of the second straight line portion 20B. However, when the situation of the excess adhesive does not occur, the positioning pattern does not need to be separated in the extension direction of the second straight line portion 20B.

In addition, the positioning pattern elements 32B and 32C are separated in the extension direction of the second straight line portion 20B in the second embodiment, as well. However, when the situation of the excess adhesive does not occur, the portion of the positioning pattern touching the second straight line portion 20B does not need to be separated in the extension direction of the second straight line portion 20B. For example, the positioning pattern may be configured with one positioning pattern element touching the first straight line portion 20A and one positioning pattern element touching the second straight line portion 20B.

In addition, in the first through third embodiments, the wiring pattern 24 may be formed on the front surface of the substrate 16 along with the positioning patterns 18, 32, and 42 in the pattern forming process (S102). However, the process of forming the wiring pattern 24 may also be separate from the process of forming the positioning patterns 18, 32, and 42. In this case, the positioning patterns 18, 32, and 42 may have different materials and/or thicknesses.

In addition, in the first through third embodiments, the semiconductor device 14 is rectangular. However, the present invention may be applied to a semiconductor package that includes a semiconductor device having a shape other than rectangular as long as the shape has a straight line portion on the outer periphery.

In addition, in the first through third embodiments, the semiconductor device 14 is the light receiving element that includes the photodiode array for detecting optical displacement. However, the present invention may be applied to a semiconductor package that includes a different optical semiconductor device or a semiconductor device other than an optical semiconductor device. When the semiconductor package includes the semiconductor device other than the optical semiconductor device, the sealing resin may, for example, be a non-transparent resin such as a black resin.

The present invention may be used in a semiconductor package that includes a semiconductor device and a substrate supporting the semiconductor device.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A semiconductor package comprising:
    a semiconductor having a straight line segment on an outer periphery;
    a substrate supporting the semiconductor; and
    a foil positioning pattern located on a front surface of the substrate, the positioning pattern touching the straight line segment of the semiconductor to set a position of the semiconductor; wherein
    the semiconductor includes, on the straight line segment on the outer periphery, a missing portion having a height from the bottom of the semiconductor that is less than the height of the semiconductor, and
    the foil positioning pattern having a height from the front surface of the substrate that is greater than the height of the missing portion and that is less than the height of the semiconductor.

2. The semiconductor package according to claim 1, wherein:
    the semiconductor includes, as the straight line segment on the outer periphery, a first straight line segment and a second straight line segment forming a right angle with respect to each other, and
    the positioning pattern touches both the first straight line segment and the second straight line segment.

3. The semiconductor package according to claim 2, wherein the positioning pattern has an "L" shape.

4. The semiconductor package according to claim 3, further comprising a notch having a shape indented away from a corner of the semiconductor located on an interior corner of the positioning pattern.

5. The semiconductor package according to claim 1, wherein
    the positioning pattern touches only one of the straight line segments on the outer periphery of the semiconductor, and
    a position of an end of the positioning pattern aligns with a position of an end of the straight line segment the positioning pattern touches.

6. The semiconductor package according to claim 1, wherein the positioning pattern is divided into a plurality of positioning pattern elements.

7. The semiconductor package according to claim 2, wherein the positioning pattern is divided into a plurality of positioning pattern elements.

8. The semiconductor package according to claim 3, wherein the positioning pattern is divided into a plurality of positioning pattern elements.

9. The semiconductor package according to claim 4, wherein the positioning pattern is divided into a plurality of positioning pattern elements.

10. The semiconductor package according to claim 5, wherein the positioning pattern is divided into a plurality of positioning pattern elements.

11. The semiconductor package according to claim 1, further comprising a foil wiring pattern located on the front surface of the substrate, a material and thickness for the wiring pattern being the same as those for the positioning pattern.

12. The semiconductor package according to claim 2, further comprising a foil wiring pattern located on the front surface of the substrate, a material and thickness for the wiring pattern being the same as those for the positioning pattern.

13. The semiconductor package according to claim 3, further comprising a foil wiring pattern located on the front surface of the substrate, a material and thickness for the wiring pattern being the same as those for the positioning pattern.

14. The semiconductor package according to claim 4, further comprising a foil wiring pattern located on the front surface of the substrate, a material and thickness for the wiring pattern being the same as those for the positioning pattern.

15. The semiconductor package according to claim 5, further comprising a foil wiring pattern located on the front surface of the substrate, a material and thickness for the wiring pattern being the same as those for the positioning pattern.

16. The semiconductor package according to claim 6, further comprising a foil wiring pattern located on the front surface of the substrate, a material and thickness for the wiring pattern being the same as those for the positioning pattern.

17. The semiconductor package according to claim 7, further comprising a foil wiring pattern located on the front surface of the substrate, a material and thickness for the wiring pattern being the same as those for the positioning pattern.

18. The semiconductor package according to claim 8, further comprising a foil wiring pattern located on the front surface of the substrate, a material and thickness for the wiring pattern being the same as those for the positioning pattern.

19. The semiconductor package according to claim 9, further comprising a foil wiring pattern located on the front surface of the substrate, a material and thickness for the wiring pattern being the same as those for the positioning pattern.

20. The semiconductor package according to claim 10, further comprising a foil wiring pattern located on the front surface of the substrate, a material and thickness for the wiring pattern being the same as those for the positioning pattern.

21. A semiconductor package comprising:
    a semiconductor having a straight line segment on an outer periphery;
    a substrate supporting the semiconductor; and
    a foil positioning pattern located on a front surface of the substrate, the positioning pattern touching the straight line segment of the semiconductor to set a position of the semiconductor; wherein
    the semiconductor includes, as the straight line segment on the outer periphery, a first straight line segment and a second straight line segment forming a right angle with respect to each other, and
    the positioning pattern touches both the first straight line segment and the second straight line segment; wherein the positioning pattern has an "L" shape, and
    further comprising a notch having a shape indented away from a corner of the semiconductor located on an interior corner of the positioning pattern.

22. A semiconductor package comprising:
    a semiconductor having a straight line segment on an outer periphery;
    a substrate supporting the semiconductor; and
    a foil positioning pattern located on a front surface of the substrate, the positioning pattern touching the straight line segment of the semiconductor to set a position of the semiconductor; wherein
    the positioning pattern touches only one of the straight line segments on the outer periphery of the semiconductor, and a position of an end of the positioning pattern aligns with a position of an end of the straight line segment the positioning pattern touches.

23. A semiconductor package comprising:
a semiconductor having a straight line segment on an outer periphery;
a substrate supporting the semiconductor; and
a foil positioning pattern located on a front surface of the substrate, the positioning pattern touching the straight line segment of the semiconductor to set a position of the semiconductor; wherein the positioning pattern is divided into a plurality of positioning pattern elements.

24. A semiconductor package comprising:
a semiconductor having a straight line segment on an outer periphery;
a substrate supporting the semiconductor;
a foil positioning pattern located on a front surface of the substrate, the positioning pattern touching the straight line segment of the semiconductor to set a position of the semiconductor, and
a foil wiring pattern located on the front surface of the substrate, a material and thickness for the wiring pattern being the same as those for the positioning pattern.

* * * * *